United States Patent
Petitjean

(10) Patent No.: US 11,458,660 B2
(45) Date of Patent: Oct. 4, 2022

(54) METHOD FOR MANUFACTURING AN ENCLOSURE ASSEMBLY FOR A UTILITY METER AND SAME

(71) Applicant: Landis+Gyr AG, Cham (CH)

(72) Inventor: Pascal Petitjean, Montlucon (FR)

(73) Assignee: Landis+Gyr AG, Cham (CH)

( * ) Notice: Subject to any disclaimer, the term of this patent is extended or adjusted under 35 U.S.C. 154(b) by 0 days.

(21) Appl. No.: 16/972,437

(22) PCT Filed: May 28, 2019

(86) PCT No.: PCT/IB2019/054405
§ 371 (c)(1),
(2) Date: Dec. 4, 2020

(87) PCT Pub. No.: WO2019/234552
PCT Pub. Date: Dec. 12, 2019

(65) Prior Publication Data
US 2021/0229329 A1 Jul. 29, 2021

(30) Foreign Application Priority Data
Jun. 6, 2018 (CH) .................................... 00726/18

(51) Int. Cl.
*B29C 45/10* (2006.01)
*B29C 45/16* (2006.01)
*G01D 4/02* (2006.01)
*B29L 31/00* (2006.01)

(52) U.S. Cl.
CPC ............. *B29C 45/164* (2013.01); *G01D 4/02* (2013.01); *B29L 2031/752* (2013.01)

(58) Field of Classification Search
CPC .................. B29C 45/164; B29C 45/26; B29C 2045/2651; B29C 2045/2679; B29C 2045/2683; G01D 4/02; B29L 2031/752; G01R 11/04
See application file for complete search history.

(56) References Cited

U.S. PATENT DOCUMENTS 5,989,480 A * 11/1999 Yamazaki ........... B29C 45/1418
264/511
2017/0074691 A1 3/2017 Baird et al.

FOREIGN PATENT DOCUMENTS

| CH | 684 215 A5 | 7/1994 |
| GB | 2 326 243 A | 12/1998 |
| JP | S62-68714 A | 3/1987 |

(Continued)

OTHER PUBLICATIONS

International Search Report and Written Opinion, PCT Patent Application No. PCT/IB2019/054405, dated Sep. 10, 2019, 12 pages.

(Continued)

*Primary Examiner* — Matthew J Daniels
*Assistant Examiner* — Shibin Liang
(74) *Attorney, Agent, or Firm* — Kilpatrick Townsend & Stockton LLP

(57) ABSTRACT

A method for manufacturing an enclosure for a utility meter is provided, wherein at least two of a main cover part, an exterior terminal cover part, and an interior terminal cover part are at least partly formed jointly as a cover assembly in an injection moulding device. Further provided is a utility meter with an enclosure manufactured by the method.

13 Claims, 4 Drawing Sheets

(56) References Cited

FOREIGN PATENT DOCUMENTS

| KR | 100849534 | * | 7/2008 | ............. | B29C 45/26 |
| RU | 167008 | * | 7/2016 | ............. | G01R 11/04 |

OTHER PUBLICATIONS

Anonymous, "What is the Difference Between a Multi-Cavity Mold and a Family Mold?", Jun. 1, 2015, available at https://rexplastics.com/faq/what-is-the-difference-between-a-multi-cavitv-mold-and-a-family-mold, 5 pages.
Toth, "Injection Molding Multiple Parts in One Injection Mold", Oct. 11, 2017, available at http://tothmold.net/injection-molding-multiple-parts-in-one-injection-injection-mold, 5 pages.
Rees et al., "Chapter: Mold Selection", Jan. 1, 2006, Selecting Injection Molds; Weighing Cost vs. Productivity, Carl Hanser Verlag GmbH & Co. KG., pp. 113-158.

\* cited by examiner

METHOD FOR MANUFACTURING AN ENCLOSURE ASSEMBLY FOR A UTILITY METER AND SAME

The present invention relates to a method for manufacturing an enclosure for a utility meter, and to a utility meter having an enclosure.

TECHNOLOGICAL BACKGROUND

Utility meters, for example electricity meters, are known from the prior art and serve for determining an amount of consumption of a medium, like water or gas, or of electrical energy supplied. In order to connect the utility meter to a power supply or to a source of electrical energy to be supplied and metered, utility meters comprise conductor connection devices including terminals configured to take up bared ends of electrical lines delivering the electrical energy. For measuring the consumption as well as for communicating over wired and wireless connections, the utility meters comprise electrical circuits, for example provided on and as printed circuit boards. Furthermore, the utility meters comprise control elements, like displays, push buttons, and alike, so that they may be adjusted and operated by respective operators, like e.g. personnel installing and maintaining the utility meters.

The terminals, electrical circuits and control elements on the one hand need to be protected against harmful environmental impacts, like dust, moisture, and alike, as well as against tampering. On the other hand, customers of the electrical energy as well as operators need to be protected against electrical shock from the electrical lines. Therefore, the terminals, electrical circuits and control elements are housed in by means of enclosures. These enclosures are commonly comprised of several parts which can be formed by injection moulding of synthetic materials. For example, a terminal cover part is formed and arranged to cover the terminals such that they can be accessed only by an admitted professional operator. An exterior cover part is formed and arranged so that it protects electrical circuits and may provide access to the control elements at a front side of the utility meter. A base part is provided to at least partly enclose the terminals, electrical circuits and control elements at a back side the utility meter, and commonly also serves for mounting the utility meter to in an electric cabinet or to a wall of a building or construction where the utility meter is installed.

Designs for such enclosures known from the prior art have the disadvantage that the terminal cover part, the exterior cover part, and the base part are produced independently of each other. This leads to increased manufacturing, shipping and assembly efforts and consequently can make the production of the enclosures and thus the utility meters cumbersome and costly.

DESCRIPTION OF THE INVENTION

It is an object of the present invention, to at least partly mitigate some of the above-mentioned disadvantages of enclosures for utility meters known from the prior art. In particular, an object underlying the invention is to provide a method for facilitated, fast and efficient production and assembly of the enclosures.

In a method for manufacturing an enclosure for a utility meter, these objects are at least partly achieved in that at least two of a main cover part, an exterior terminal cover part, and an interior terminal cover part of the enclosure are at least partly formed jointly as a cover assembly in an injection moulding device For an above-mentioned utility meter, these objects are at least partly achieved in that it is provided with an enclosure manufactured by a method according to the present invention.

Thereby, the number of productions steps necessary for providing the enclosure can be reduced. The parts can be produced in a single injection moulding device at a single manufacturing facility. Hence, the manufacturing process of the parts of the enclosure is simplified. When at least two of the main cover part, the interior terminal cover part, and the exterior terminal cover part are formed as the cover assembly, e.g. as an integrated injection moulding arrangement, also steps for assembling the enclosure and therefore the utility meter can be simplified and reduced. Shipping of parts of the enclosure obtained from different manufacturers can be avoided. Costs can be saved and the environmental impact of manufacturing the enclosure and the utility meter minimised.

Unless explicitly stated to the contrary, the solutions according to the invention can be combined as desired and further improved by the further following embodiments that are advantages on their own, in each case. A skilled artisan will readily recognise that any method steps and features mentioned of the embodiments of a method according to the present invention can be easily implemented as apparatus features of an enclosure for a utility meter according to the present invention, and vice versa.

According to a possible embodiment, the cover assembly is at least partly formed with a single injection charge in an injection moulding tool. Using only a single injection charge for at least section-wise forming several parts of the cover assembly, helps minimising the production time of the cover assembly. Forming the cover assembly in preferably a single injection tool helps minimising the number of injection tools to be provided for manufacturing the enclosure. For example, in line with a method according to the present invention, preferably maximally three injection moulding tools, more preferably two injection moulding tools, or most preferably one injection moulding tool is sufficient for forming the enclosure or at least the essential parts, meaning insulating housing parts, thereof.

According to a possible embodiment, the at least two of the main cover part, the exterior terminal cover part, and the interior terminal cover part are at least partly formed simultaneously during a moulding step. By forming the parts simultaneously, again manufacturing time can be saved and complexity of the manufacturing process further reduced. For example, the parts may be formed simultaneously by said single injection charge.

According to a possible embodiment, the at least two of the main cover part, the exterior terminal cover part, and the interior terminal cover part are connected to each other by at least one runner in a mould cavity. By connecting the parts with at least one runner, a number of injection nozzles to be provided at the injection moulding tool and a respective number of sprues to be provided within the injection moulding tool can be reduced. For example, a single nozzle and sprue may be sufficient for at least partly forming the at least two of the main cover part, the exterior terminal cover part, and the interior terminal cover part. This helps in further accelerating and facilitating the manufacturing process.

According to a possible embodiment, the at least one first runner connects the main cover part to the exterior terminal cover part. Thereby, at least section-wise, the main cover part and the exterior terminal cover part may be formed jointly as at least a part of the cover assembly. Furthermore, these parts can be manufactured of the same material, i.e. a thermoplastic synthetic material or alike, which can have desired properties to be provided to the main cover part and the terminal cover part, like e.g. same dielectric properties, elasticity, rigidity, colour, texture, etc.

According to a possible embodiment, the at least one second runner connects the main cover part to the interior terminal cover part. Thereby, at least section-wise, the main cover part and the interior terminal cover part may be formed jointly as at least a part of the cover assembly. Furthermore, these parts can be manufactured of the same material, i.e. a thermoplastic synthetic material or alike, which can have desired properties to be provided to the main cover part and the terminal cover part, like e.g. same dielectric properties, elasticity, rigidity, colour, texture, etc.

According to a possible embodiment, the cover assembly comprises an outer cover portion and an inner cover portion, wherein the outer cover portion is being connected to the exterior terminal cover part by the at least one first runner, and wherein the inner cover portion is being connected to the exterior terminal cover part by the at least one second runner. The cover part may comprise the outer cover portion and inner cover portion. The outer cover portion and the inner cover portion may be integrally formed. Thereby, the exterior terminal cover part may be formed jointly with the outer cover portion. The interior terminal cover may be formed jointly with the inner cover portion.

According to a possible embodiment, the main cover part and at least one of the exterior terminal cover part, and the interior terminal cover part are at least partly formed simultaneously during a first moulding step. For example, during the first moulding step, the outer cover portion and exterior terminal cover part may be formed and respective cavities of the injection moulding tool. Alternatively, or additionally, the exterior terminal, part and the outer cover portion may be formed during the first moulding step.

According to a possible embodiment, the main cover part and at least one of the exterior terminal cover part, and the interior terminal cover part are at least partly formed simultaneously during a further moulding step. Especially, if during the first moulding step, the outer cover portion and exterior terminal cover part are formed, then in the further moulding step, the inner cover portion and interior terminal cover part can be formed or vice versa. It is also possible, to only provide the main cover part as a single piece, and to provide the exterior terminal cover part and internal terminal cover part as two pieces. In any way, production complexity and time may be further reduced.

According to a possible embodiment, the main cover part comprises an injection moulded display portion formed during an additional moulding step. The display portion may be provided e.g. in the inner cover portion. Hence, the inner cover portion together with the display portion can be moulded by a bi-injection step sequence, for example comprising the first moulding step of the second moulding step and the additional moulding step. This helps in providing the main cover part as a single piece without the necessity to assemble the main cover part of the display portion as it would be the case if they would stem from different production lines. Thus, the production process is further facilitated and accelerated.

According to a possible embodiment, the exterior terminal cover part and/or the interior terminal cover part comprise or comprises, respectively, a locking member formed during an auxiliary moulding step. The locking member may be formed as a cabinet lock, slider, latch or alike, which can be moulded to and/or into the exterior terminal cover part and/or the interior terminal cover part in the course of the auxiliary moulding step. The auxiliary moulding step may also be carried out simultaneously to the first moulding step, the further moulding step, and/or the additional moulding step. In other words, the auxiliary moulding step can be integrated into or part of the first moulding step, the further moulding step, and/or the additional moulding step. Alternatively, or additionally, the locking member can be formed separately and then assembled with the exterior terminal cover part and/or the interior terminal cover part, for example by being inserted into a respective receptacle formed at the exterior terminal cover part and/or the interior terminal cover part.

According to a possible embodiment, the cover assembly is formed in an operating sequence in the injection moulding device. The operating sequence comprises the first moulding step, the further moulding step, the additional moulding step, and/or the auxiliary moulding step. The steps may be carried out in series or in parallel to each other i.e. simultaneously. Preferably, as many steps as possible are carried out and parallel to each other to save production time. However, whenever different materials have to be used for the respective part or portions of the cover assembly, then the respective moulding steps have to be carried out after each other. This is the case for example for the main cover part as it is provided with the display portion. While the outer cover portion and/or in a cover portion may be formed of the same material, which is preferably opaque, i.e. untransparent, the display portion must be transparent. Hence, the additional moulding step as most probably carried out before or after at least one of the first moulding step, the further moulding step, and the auxiliary moulding step According to a possible embodiment, the enclosure further comprises a base assembly comprising a base part and an assembly member formed in another operating sequence in the injection molding device or another injection moulding device. For example, the assembly member is formed as an assembly hook, lock and/or latch, and serves for locking the main cover part, the exterior terminal cover part, and/or the interior terminal cover part to the base. Similar to the cover assembly, also the base assembly may be injection moulded in a single operating sequence, preferably in a single moulding step. Therefore, the base assembly may be formed in a single injection moulding tool. In the tool, a cavity for the base part and a cavity for the assembly member may be connected to each other by at least one runner. Hence, the base part and the assembly member may be formed essentially simultaneously.

Consequently, the number of productions steps necessary for providing the enclosure can be further reduced. The cover assembly and the base assembly can be produced in two injection moulding devices or preferably a single injection moulding device at a single manufacturing facility. Hence, the manufacturing process of the enclosure is simplified. By providing the base assembly, e.g. as an integrated injection moulding arrangement, also steps for assembling the enclosure and therefore the utility meter can be simplified and reduced. Shipping of parts of the enclosure obtained from different manufacturers can be avoided. Costs can be saved and the environmental impact of manufacturing the enclosure and the utility meter minimised.

According to a possible embodiment, the base assembly is at least partly formed with a single injection charge in an injection moulding tool. Using only a single injection charge for at least section-wise forming several parts of the base assembly helps minimising the production time of the base assembly. Forming the base assembly in preferably a single injection tool helps minimising the number of injection tools to be provided for manufacturing the enclosure. For example, in line with a method according to the present invention, preferably three or most preferably two injection moulding tools are sufficient for forming the enclosure or at least the essential parts, meaning insulating housing parts thereof.

According to a possible embodiment, the cover assembly is assembled in a cover assembly device, and/or the base assembly is assembled in a base assembly device, respectively. The cover assembly device may include an automatic cover assembly line. The base assembly device may include an automatic base assembly line. Thereby, the cover assembly and the base assembly may be assembled automatically. Both assembly lines may be united or joined, so that the enclosure may be assembled automatically which helps to further accelerate and facilitate the manufacturing process of the enclosure and thus of the utility meter.

Furthermore, the enclosure maybe designed and arranged such that it serves as an insulating housing for a conductor connection device of the utility meter, which insulating housing is constituted with a cover plate of the utility meter as a single piece, wherein the cover plate separates an installation space for meter electronics from a user accessible space of the utility meter. The insulating housing may comprise a contact side with a contact opening that opens to the installation space and/or away from the cover plate.

BRIEF DESCRIPTION OF THE DRAWINGS

The invention will be described hereinafter in more detail and in an exemplary manner using advantageous embodiments and with reference to the drawings. The described embodiments are only possible configurations in which, however, the individual features as described above can be provided independently of one another or can be omitted. In the drawings.

WAYS OF EXECUTING THE INVENTION

Figure 1:
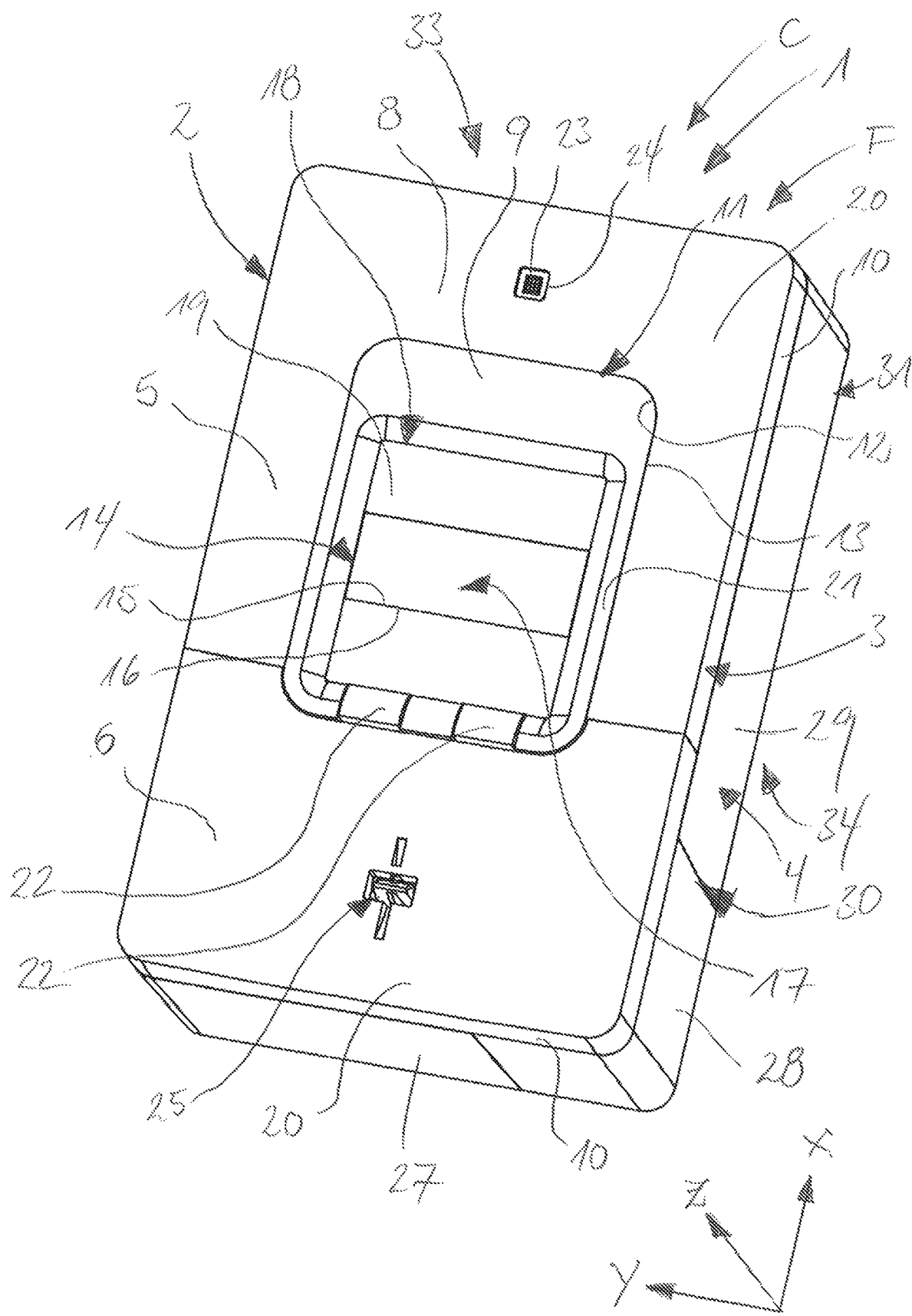
FIG. 1 shows a schematic perspective view of an exemplary embodiment of a utility meter with a first embodiment of an enclosure according to the present invention in a fully assembled state.

FIG. 1 shows a schematic perspective view of an exemplary embodiment of a utility meter 1 according to the present invention in a fully assembled state F. The utility meter extends along a longitudinal direction X, a transverse direction Y, and a height direction Z, together constituting a Cartesian coordinate system. The utility meter 1 has a first embodiment on an enclosure 2 providing an insulating housing for accommodating electronic components and conductor connection devices of the utility meter 1. The enclosure 2 comprises a cover 3 and a base 4. The cover 3 comprises a main cover part 5, an exterior terminal cover part 6, and an interior terminal cover part 7, 7' (see FIGS. 2 to 4).

The main cover part 5 has an outer cover portion 8 and an inner cover portion 9. The outer cover portion 8 circumferentially surrounds the inner cover portion 9 and provides a cover rim 10 as well as a cover opening having an inner circumference 12 encompassing an outer circumference 13 of the inner cover portion 9. The inner cover portion 9 is provided with a display opening 14 having an inner circumference 15 encompassing an outer circumference 16 of a display portion 17 of the main cover part 5. The display portion 17 is embedded within the display opening 14 which is arranged in the region of a front recess 18 of the main cover part 5, so that the display portion 17 lies flush with the recessed front face 19. In the region of the front recess 18, a recessed front face 19 of the main cover part 5 is recessed with respect to a front face 20 of the main cover part 5 in that it is arranged lower than the front face 19 in the height direction Z. Therefore, a bevel 21 is formed between the front face 20 and the recessed front face 19. In the region of the bevel 21, control elements 22 the form of push buttons for controlling operation of the utility meter 1 are arranged. A further display portion 23 is embedded within a further display opening 24 located at the front face 20 of the main cover part 5 and may lie flush with the front face 20, or is slightly recessed with respect to the front face 20 in the height direction Z.

The exterior terminal cover part 6 lies flush with the main cover part 5 and therefore also forms a part of the cover rim 10 and of the front face 20 of the utility meter 1. An access opening 25 is provided in the front face 20 in order to be able to use a tool (not shown) to access an assembly member 26 located at the interior terminal cover part 7 and locking the cover 3 to the base 4 in a closed position C of the enclosure 2 shown in FIG. 1 (see FIGS. 2 to 4). The terminal cover part 6 also provides a bottom wall 27 and a lower sidewall section 28 of the enclosure 2 which lies flush with an upper side wall section 29 of the enclosure 2, whereby the lower side wall section 28 and the upper side wall section 29 together form a sidewall 30 of the enclosure 2.

Figure 2:
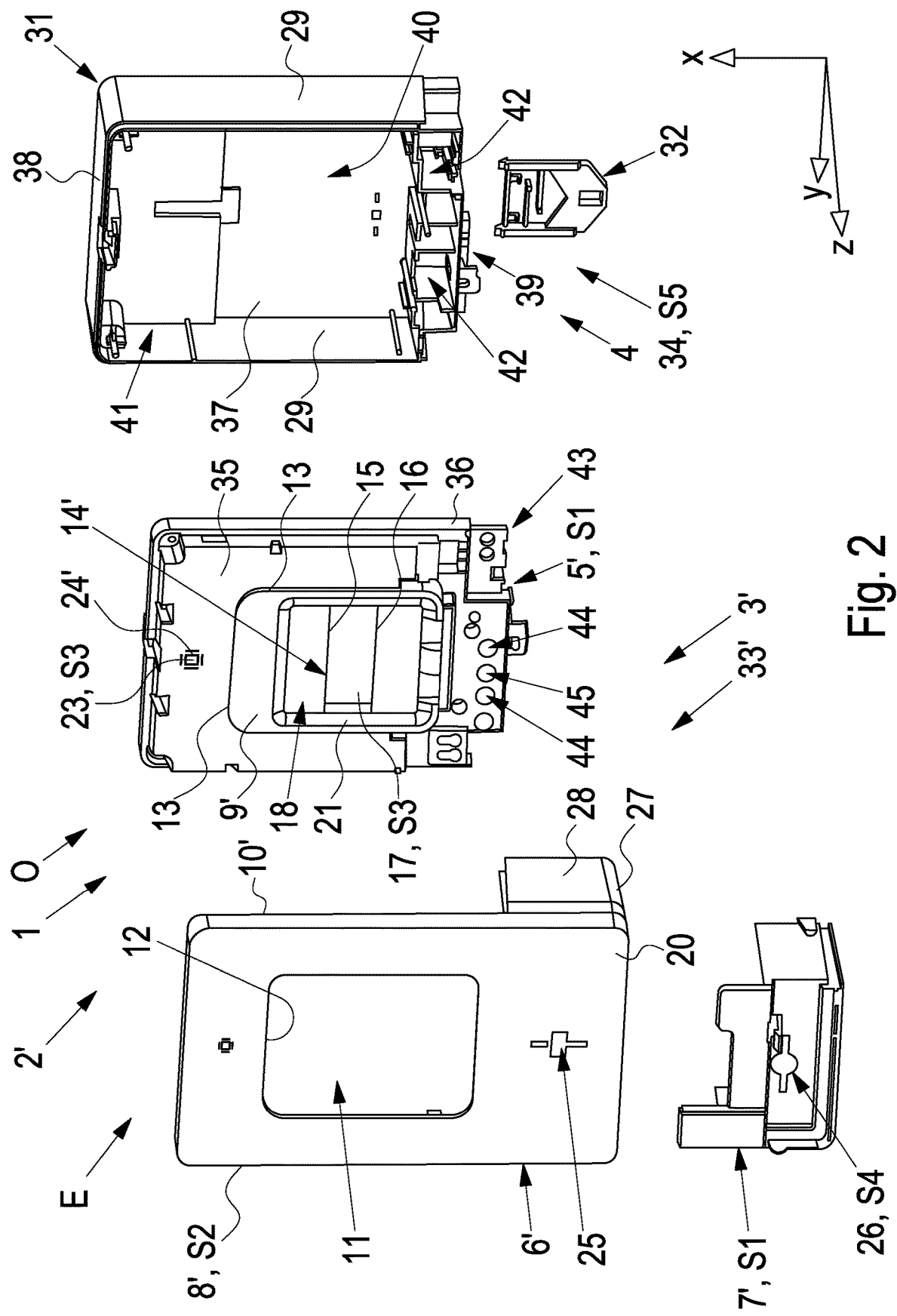
FIG. 2 shows schematic exploded view of an exemplary embodiment of a second embodiment of an enclosure of the utility meter according to the present invention.
Figure 3:
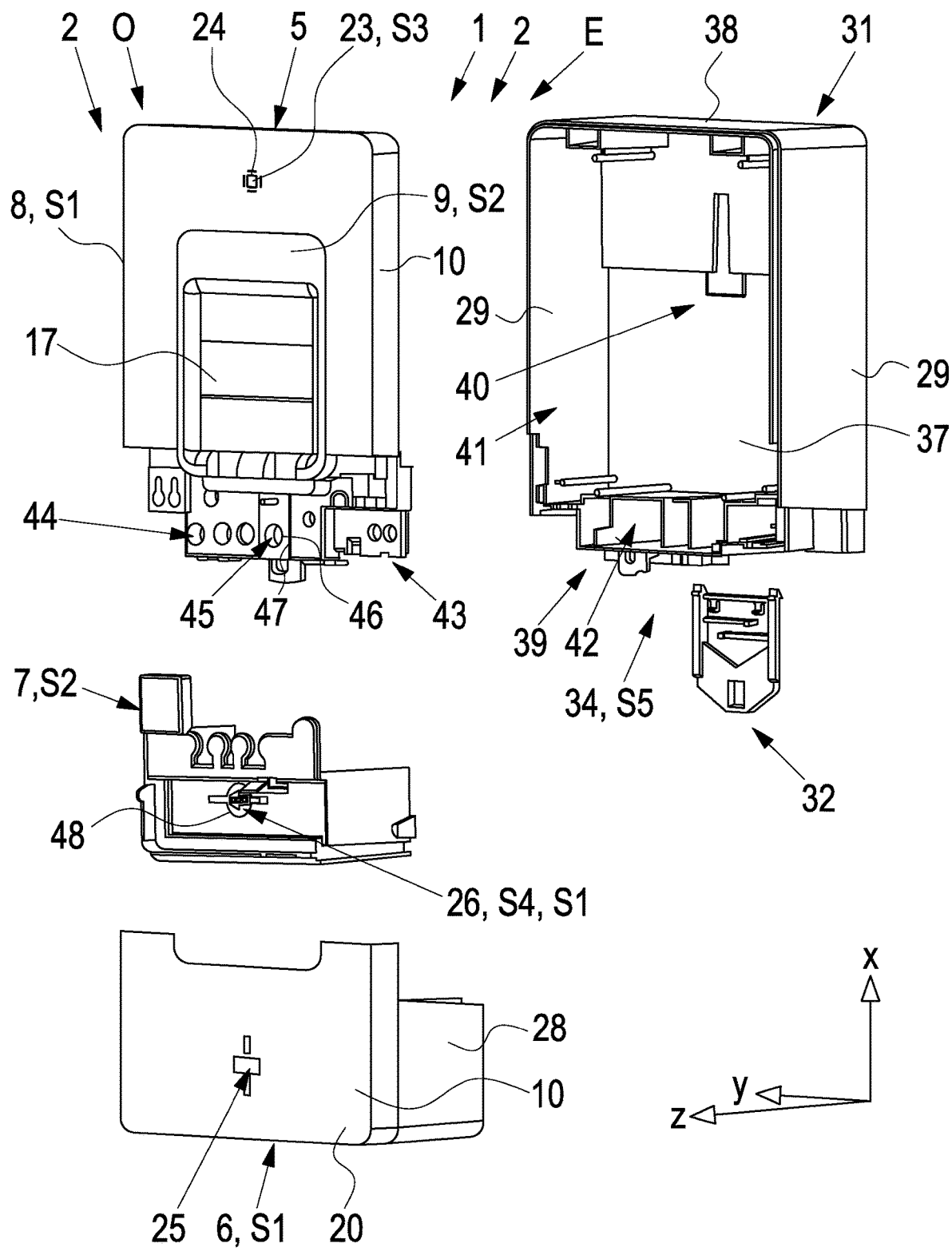
FIG. 3 shows schematic exploded view the first embodiment of the enclosure of the utility meter according to the present invention shown in FIG. 1.
Figure 4:
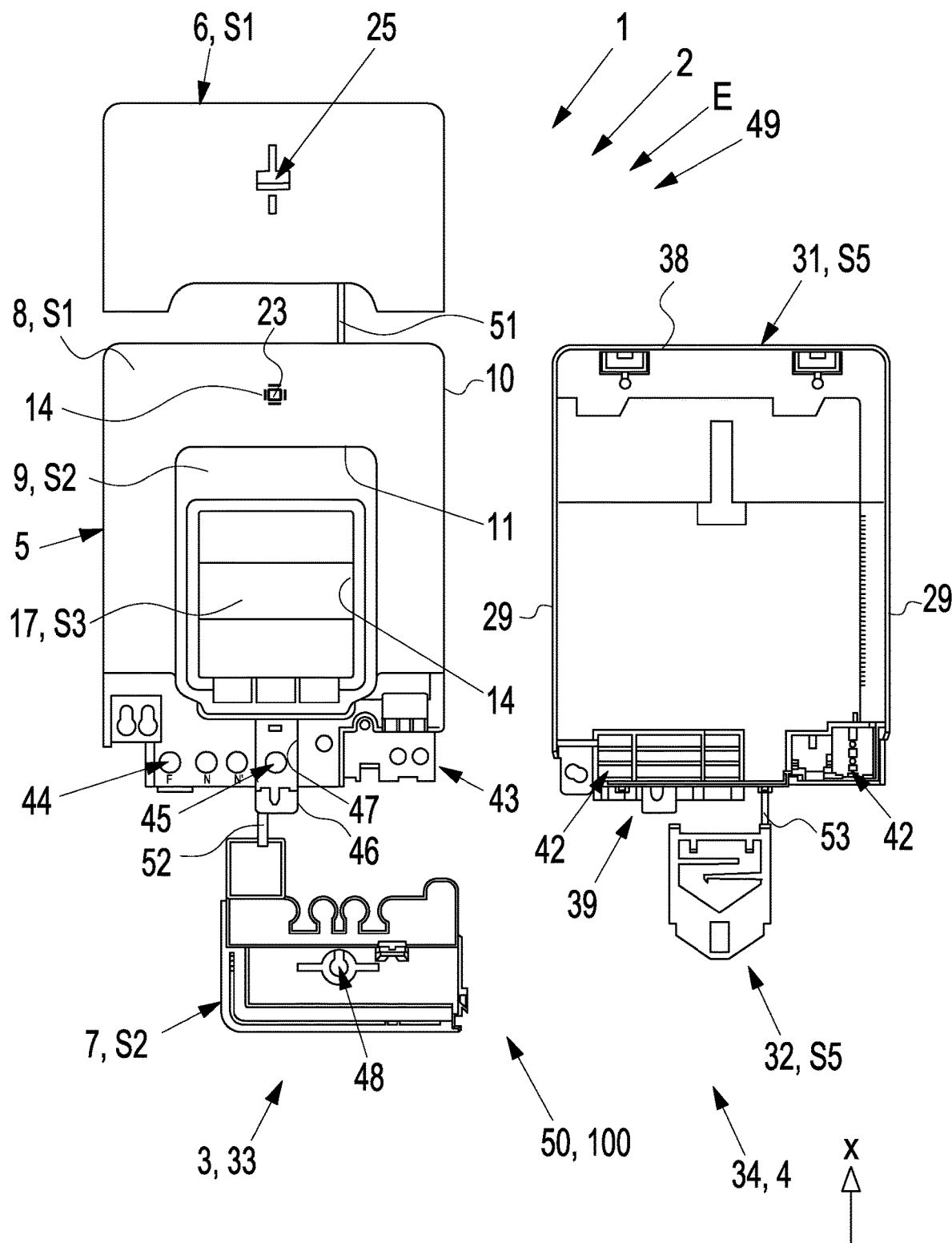
FIG. 4 shows schematic front view of the first embodiment of the enclosure of the utility meter shown in FIG. 1 as an injection moulding arrangement in an injection moulding tool according to the present invention.

The base 4 comprises a base part 31 an assembly member 32 (see FIGS. 2 to 4). The upper side wall section 29 is formed at the base part 31. During manufacturing of the enclosure 2, the cover 3 comprising the main cover part 5, the exterior terminal cover part 6, the interior terminal cover part 7, and the display portion 17 are provided as a cover assembly 33, while the base 4, comprising the base part 31 and the assembly member 32 are provided as a base assembly 34.

FIG. 2 shows schematic exploded view of a second exemplary embodiment of an enclosure 2' of the utility meter 1 according to the present invention in a pre-assembled state E of the utility meter 1. For the sake of brevity, only the differences between the first embodiment of the enclosure 2 shown in FIG. 1 and the second embodiment of the enclosure 2' shown in FIG. 2 will be explained in the following, while any functions and features which the first embodiment of the enclosure 2 and the second embodiment of the enclosure 2' have in common will be laid down jointly.

The enclosure 2' comprises a cover 3' and the base 4'. The cover 3' comprises a main cover part 5', an exterior terminal cover part 6', and an interior terminal cover part 7'. An outer cover portion 8' is integrally formed with the exterior terminal cover part 6' and therefore provides a continuous part of the front face 20 including the front opening 11 as well as the access opening 25, and further comprises the bottom wall 27 and the lower sidewall section 28, whereby a continuous cover rim 10' circumferentially extending along the outside of the enclosure 2' is provided.

The main cover part 5' of the cover 3' is provided with an outer cover portion 8' having an outer circumference 13' to be received and the cover opening 11, so that the outer cover portion 8' and the inner cover portion 9' are aligned with each other with the outer circumference 13' being encompassed by the inner circumference 12 of the cover opening such that a flush front face 20 is formed by the outer cover portion 8' and the inner cover portion 9'. The main cover part 5' further comprises a display opening 14' and a further display opening 24' which hold the display portion 17 and the further display portion 23, respectively, and provides an inner front face 35 and an inner cover rim 36 of the enclosure 2'.

The base 4 has a bottom wall 37 which is surrounded sidewise, i.e. in and against the transverse direction Y, by the side wall section 29 and each side of the enclosure 2, 2', as well as by a top wall 38 at the top of the enclosure 2, 2' facing into the longitudinal direction X, and by a connection section 39 of the enclosure 2, 2' facing away from the base part 31 in a direction extending opposite to the longitudinal direction X. The side wall sections 29, the top wall section 38 and the connection section 39 circumferentially surround an inner space 40 of the enclosure 2, 2' which is further limited at the back of the enclosure 2, 2' by the bottom walls 37. The inner space 40 is to be accessed via an installation opening 41 to be closed by the main cover part 5, 5', and serves for taking up a printed circuit board (not shown), e.g. to be mounted to the bottom wall 37.

The connection section 39 is provided with a number of receptacles 42 configured for receiving conductor connection devices (not shown) adapted to connect electrical conductors (not shown) to the utility meter 1. The assembly member 32 serves for fixing the main cover part 5, 5' to the base 31 when the main cover part 5, 5' is joined with the base 31 for closing the installation opening 41 and thereby closing up the inner space 40. A terminal cover portion 43 of the main cover part 5, 5 then covers the connection section 39 and provides access to terminals (not shown) of the conductor connection devices through respective terminal access openings 44 extending along the longitudinal direction Z formed in the main cover part 5, 5.

The interior terminal cover part 7, 7' is formed such that it covers up the conductor cover portion 43 with the terminal axis openings 44 of the main cover part 5, 5' when the interior terminal cover part 7, 7 is mounted to the main cover part 5, 5'. For fixing the interior terminal, part 7, 7' to the main cover part 5, 5' in the mounted position, the locking member 26 is to be inserted into a counter locking member 45 formed at the main cover part 5, 5 in the form of a receiving opening configured to receive the locking member 26 such that the counter locking member 45 can be brought into an interlocking engagement with each other, thereby at least partly transferring the enclosure 2, 2' from an open position O to the closed position C.

During manufacturing of the enclosure 2', the cover 3 comprising the main cover part 5', the exterior terminal cover part 6', the interior terminal cover part 7', and the display portion 17 are provided as a cover assembly 33', while the base 4, comprising the base part 31 and the assembly member 32 are provided as the base assembly 34. The main cover part 5' and the interior terminal cover part 7' can be formed in a first moulding step S1. The exterior terminal cover part 6' can be formed in a further moulding step S2. The display portion 17 and/or the further display portion 23 can be formed in an additional moulding step S3. The locking member 26 can be formed in an auxiliary moulding step S4. The base part 31 and the assembly number 32 can be formed in another moulding step S5. The further moulding step S2 and the auxiliary moulding step S4 may be combined with each other.

Hence, an injection moulding sequence for forming the cover assembly 33' can be concluded by performing overall five injection moulding operations. The exterior terminal cover part 6', the interior terminal cover part 7', and the locking member 26 can be produced during a group of subsequent operations comprising three of the overall five moulding operations, namely by the further moulding step S2, the first moulding step S1, and the auxiliary moulding step S4, respectively, thus representing a three-injection sequence. The main cover part 5' can be produced during a further group of subsequent operations comprising two of the overall five operations, namely the first moulding step S1 and the additional moulding step, thus representing a two-injection sequence. The base assembly 31 can be produced by performing the respective other moulding step S5 in such a way that the base part 31 and the assembly member 32 are moulded simultaneously, thus representing a single-injection operation.

FIG. 3 shows schematic exploded view of the first exemplary embodiment of the enclosure assembly 2 of the utility meter 1 according to the present invention shown in FIG. 1. In FIG. 3 it becomes apparent that the inner cover portion 9 is provided with a bridge section 46 which extends downward from the inner cover section 9 in a direction opposite to the longitudinal direction X. The bridge section is arranged in a notch formed in the outer cover portion 8. The counter locking member 45 is arranged in the bridge section 46. The locking member 26 is arranged in a locking member receptacle 48 formed in the interior terminal cover part 7, 7'. In the present embodiments, as an example, the locking member is provided rotatable within the locking receptacle and therefore functions as a sort of cabinet lock.

An injection moulding sequence for forming the cover assembly 33 can be concluded by performing overall four injection moulding operations. The outer cover portion 8 of the main cover part 5, and the exterior terminal cover part 6 can be produced simultaneously in combination with the locking member 23 during the first moulding step S1 and the additional moulding step S4 together constituting a single-injection operation as a first operation of the overall four injection moulding operations. The inner cover portion 9 and the interior terminal cover part 7 can be produced during the further second injection moulding step in another single-injection operation as a second operation of the overall four injection moulding operations. The display portion 17 and the further display portion 23 can be formed during the additional moulding step S3 in a further single-injection operation as a third operation of the overall four injection moulding operations. The cover assembly 33 can be moulded in a three-injection sequence comprising the first moulding step S1, the further moulding step S2, the additional moulding step S3 and/or the auxiliary moulding step S4, respectively, thus representing a three-injection sequence. The base assembly 31 can again be produced by performing the respective other moulding step S5 in such a way that the base part 31 and the assembly member 32 are moulded simultaneously, thus representing a single-injection operation.

FIG. 4 shows schematic front view of the enclosure assembly 2 of the first embodiment of the enclosure 2 of the utility meter shown in FIG. 1, in the pre-assembled state E, wherein an enclosure assembly 49 comprising the cover assembly 33 and the base assembly 34 is arranged as an injection mould arrangement 50. In the injection mould arrangement 50, the main cover part 5, the exterior terminal cover part 6, the interior terminal cover part 7, the outer cover portion 8, and the inner cover portion 9 on the side of the cover assembly 33, and the base part 31 and the assembly member 32 on the side of the base assembly 34 are located and arranged as well is provided with runners 51 to 53 such as if they were placed in a moulding tool 100. Hence, and negative form of the injection mould arrangement 50 represents the moulding tool 100, or at least cavities thereof, according to an embodiment of the present invention, comprising a cover mould 101, and a base mould 102 as cavities for moulding the cover assembly 33, and/or the base assembly 34, respectively.

The runners 51 to 53 of the moulding arrangement 50 are arranged such that a first runner 51 connects the exterior terminal cover part 6 to the outer cover portion 8 of the main cover part 5, in particular in the region of the cover rim 10. A second runner 52 connects the inner cover portion 9 of the main cover part 5 to the interior terminal cover part 7. In particular, the second runner 52 extends between the bridge section 46 of the inner cover portion 9 and the interior terminal cover part 7. The bridge section 46 juts below the lower edge of the conductor cover portion 43. In other words, the bridge section 46 extends beyond a lower edge of the outer cover portion 8 in the direction opposite to the longitudinal direction X. The third runner 53 connects the base part 31, in particular the connection section 39 thereof, to the assembly member 32.

Hence, as the first moulding step S1, the outer cover portion 8 of the main cover part 5, and the exterior terminal cover part 6 can be formed by providing a sprue leading to at least one of the respective cavities of the injection moulding tool 100 which are connected to each other by the runner 51. Subsequently, as the second moulding step S2, the inner cover portion 9 of the main cover part 5, and the interior terminal, part 7 can be formed by providing a sprue leading to at least one of the respective cavities of the injection moulding tool 100 which are connected to each other by the second runner 52. Then, as the third moulding step S3, the display portion 17 and the further display portion 23 can be formed by providing sprues leading to respective cavities of the injection moulding to 100. Finally, either simultaneously to at least one of the first to third moulding steps S1 to S3, for example in parallel to the second moulding step S3, the base part 31, and the assembly member 32 can be formed by providing a sprue leading to at least 1 of the respective cavities of the injection moulding tool 100 which are connected to each other by the runner 53.

For assembling the cover 3, 3' and the base 4 from the cover assembly 33, 33', and the base assembly 34, a respective automatic assembly line (not shown) may be provided. Assembly of the enclosure 2, 2' starting from the cover 3, 3' and the base 4, or the enclosure assembly 49 may be performed on an automatic assembly line (not shown). Assembly of the utility meter 1 may be performed, starting from each one of the cover assembly 33, 33', the base assembly 34, or the enclosure assembly 49, 49' on an automatic assembly line (not shown).

Deviations from the above-described embodiments are possible without departing from the scope of the present invention. The utility meter 1 may comprise enclosures 2, 2', serving as insulating housing, with covers 3, 3' and bases 4 in any number and form desired for protecting operators as well as parts of the utility meter 1

The cover 3, 3' may comprise main cover parts 5, 5', exterior terminal cover parts 6, 6' interior terminal cover parts 7, 7, outer cover portions 8, 8', inner cover portions 9, 9', cover rims 10, 10', cover openings 11, inner circumferences 12, outer circumferences 13, 13', display openings 14, 14', inner circumferences 15, outer circumferences 16, display portions 17, front recesses 18, recessed front faces 19, front faces 20, bevels 21, control elements 22, further display portions 23, further display openings 24, 24', access openings 25, locking members 26, bottom walls 27, lower side wall sections 28, upper side wall sections 29, side walls 30, inner front faces 35, conductor cover portions 43, terminal access openings 44, counter locking members 45, bridge sections 46, notches 47, and/or locking member receptacles 48 in any number and form required for providing the enclosure 2, 2'.

The base 4 may comprise bottom wall 27, lower side wall sections 28, upper side wall sections 29, side walls 30, base parts 31, assembly members 32, connection sections 39, inner spaces 40, installation openings 41, and receptacles 42 in any number and form required for providing the enclosure 2, 2'.

Accordingly, the cover assembly 33, 33', the base assembly 34, and thus the enclosure assembly 49, 49' may comprise the above-mentioned parts, portions and elements of the cover 3, 3 and the base 4 in any number and form required for providing the enclosure 2, 2'.

For manufacturing the enclosure 2, 2' in a method according to the present invention, the enclosure assembly 49, 49' or at least parts thereof, e.g. the cover assembly 33, 33' and/or the base assembly 34, may be provided as an injection mould arrangement 50 with runners 51 to 53 in any number and form required for moulding the enclosure 2, 2'. Accordingly, the injection moulding tool 100 may comprise cover moulds 101, base moulds 102 as well as sliders (not shown) or alike for enabling multi-injection moulding operations, in particular in the region of any openings, such as the display opening 14, 14', the front recesses 18, the further display opening 24, 24', access openings 25, installation openings 41, receptacles 42, notches 47, and/or locking member receptacles 48 in any number and form required for providing the enclosure 2, 2'.

REFERENCE SIGNS

| | |
|---|---|
| 1 | utility meter |
| 2, 2' | enclosure/insulating housing |
| 3, 3' | cover |
| 4 | base |
| 5, 5' | main cover part |
| 6, 6' | exterior terminal cover part |
| 7, 7' | interior terminal cover part |
| 8, 8' | outer cover portion |
| 9, 9' | inner cover portion |
| 10, 10' | cover rim |
| 11 | cover opening |
| 12 | inner circumference |
| 13, 13' | outer circumference |
| 14, 14' | display opening |
| 15 | inner circumference |
| 16 | outer circumference |
| 17 | display portion |
| 18 | front recess |
| 19 | recessed front face |
| 20 | front face |
| 21 | bevel |
| 22 | control element |
| 23 | further display portion |

| | -continued |
|---|---|
| 24, 24' | further display opening |
| 25 | access opening |
| 26 | locking member |
| 27 | bottom wall |
| 28 | lower side wall section |
| 29 | upper side wall section |
| 30 | side wall |
| 31 | base part |
| 32 | assembly member |
| 33, 33' | cover assembly |
| 34 | base assembly |
| 35 | inner front face |
| 36 | inner cover rim |
| 37 | bottom wall |
| 38 | top wall |
| 39 | connection section |
| 40 | inner space |
| 41 | installation opening |
| 42 | receptacle |
| 43 | conductor cover portion |
| 44 | terminal access opening |
| 45 | counter locking member |
| 46 | bridge section |
| 47 | notch |
| 48 | locking member receptacle |
| 49, 49' | enclosure assembly |
| 50 | injection mould arrangement |
| 51 | first runner |
| 52 | second runner |
| 53 | third runner |
| 100 | injection moulding tool |
| 101 | cover mould |
| 102 | base mould |
| C | closed position |
| O | open position |
| E | pre-assembled state of utility meter |
| F | fully assembled state of utility meter |
| X | longitudinal direction |
| Y | transverse direction |
| Z | height direction |
| S1 | first moulding step |
| S2 | further moulding step |
| S3 | additional moulding step |
| S4 | auxiliary moulding step |
| S5 | another moulding step |

The invention claimed is:

1. A method for manufacturing an enclosure for a utility meter, wherein at least two of a main cover part, an exterior terminal cover part, and an interior terminal cover part are at least partly formed jointly as a cover assembly in an injection moulding device,
wherein in a first moulding step an outer cover portion of the main cover part and the exterior terminal cover part are formed, and in a second moulding step an inner cover portion of the main cover part and the interior terminal cover part are formed, and
wherein the outer cover portion includes an inner circumference configured to surround a first portion of an outer circumference of the inner cover portion and the exterior terminal cover part includes an inner circumference configured to surround a second portion of the outer circumference of the inner cover portion, and the exterior terminal cover part includes an access opening configured to provide access to a locking member receptacle in the interior terminal cover part.

2. The method according to claim 1, wherein the cover assembly is at least partly formed with a single injection charge in an injection moulding tool.

3. The method according to claim 1, wherein at least two of the main cover part, the exterior terminal cover part, and the interior terminal cover part are at least partly formed simultaneously during a moulding step.

4. The method according to claim 1, wherein at least two of the main cover part, the exterior terminal cover part, and the interior terminal cover part are connected to each other by at least one runner in a mould cavity.

5. The method according to claim 1, wherein at least one second runner connects the main cover part to the interior terminal cover part.

6. The method according to claim 1, wherein the main cover part comprises an injection moulded display portion formed during an additional moulding step.

7. The method according to claim 1, wherein the exterior terminal cover part and/or the interior terminal cover part comprise or comprises, respectively, a locking member formed during an auxiliary moulding step.

8. The method according to claim 1, wherein the cover assembly is formed in an operating sequence in the injection moulding device.

9. The method according to claim 1, wherein the enclosure further comprises a base assembly comprising a base part and an assembly member formed in another operating sequence in the injection moulding device or another injection moulding device.

10. The method according to claim 1, wherein the cover assembly is assembled in a cover assembly device, and/or a base assembly is assembled in a base assembly device, respectively.

11. A utility meter, comprising an enclosure manufactured by the method according to claim 1.

12. The method according to claim 1, wherein at least one first runner connects the main cover part to the exterior terminal cover part.

13. The method according to claim 12 wherein the main cover part comprises the outer cover portion and the inner cover portion, wherein the outer cover portion is being connected to the exterior terminal cover part by the at least one first runner, and wherein the inner cover portion is being connected to the exterior terminal cover part by at least one second runner.

* * * * *